United States Patent [19]
Onishi et al.

[11] Patent Number: 5,420,079
[45] Date of Patent: May 30, 1995

[54] PROCESS FOR PRODUCING SEMICONDUCTOR DEVICE COMPRISING TWO STEP ANNEALING TREATMENT

[75] Inventors: Shigeo Onishi, Nara; Akitsu Ayukawa, Tenri; Kenichi Tanaka, Nara, all of Japan

[73] Assignee: Sharp Kabushiki Kaisha, Osaka, Japan

[21] Appl. No.: 979,457

[22] Filed: Nov. 20, 1992

Related U.S. Application Data

[60] Continuation of Ser. No. 736,588, Jul. 26, 1991, abandoned, which is a division of Ser. No. 658,345, Feb. 20, 1991, abandoned.

[30] Foreign Application Priority Data

| | | | |
|---|---|---|---|
| Feb. 20, 1990 | [JP] | Japan | 2-40084 |
| Dec. 14, 1990 | [JP] | Japan | 2-417711 |
| Dec. 14, 1990 | [JP] | Japan | 2-417713 |
| Jan. 9, 1991 | [JP] | Japan | 3-12952 |

[51] Int. Cl.$^6$ ............... H01L 21/324; H01L 21/336
[52] U.S. Cl. .................... 437/247; 437/41; 148/DIG. 3
[58] Field of Search ............ 437/247, 40, 41, 44, 437/173, 174, 907, 908; 148/DIG. 3

[56] References Cited

U.S. PATENT DOCUMENTS

| | | | |
|---|---|---|---|
| 4,818,714 | 4/1989 | Haskell | 437/44 |
| 5,015,595 | 5/1991 | Wollesen | 437/41 |
| 5,183,770 | 2/1993 | Ayukawa et al. | 437/247 |
| 5,217,912 | 6/1993 | Ayukawa et al. | 437/247 |

OTHER PUBLICATIONS

Tokuyama, "Application of Laser Annealing to Silicon Device Fabrication", Laser and Electron Beam Processing of Materials, Academic Press, Inc., 1980, pp. 608–620.

Gibbons et al., "Application of CW Beam Processing to Semiconductor Device Fabrication", Laser and Electron Beam Processing of Materials, Academic Press, Inc., pp. 593–607.

Dvurechensky et al., "Laser Annealing of Ion-Implanted Semiconductors", Laser-Solid Interactions and Laser Processing-1978, American Institute of Physics, 1979, pp. 245–258.

Chu et al., "Structure Stability of Arsenic-Implanted Si After Pulsed Laser Irradiation", Laser and Electron Beam Processing of Materials, Academic Press, Inc., 1980, pp. 253–259.

White et al., "Laser Annealing of Ion Implanted Silicon", Laser-Solid Interactions and Laser Processing—1978, American Institute of Physics, 1979, pp. 275–290.

Celler et al., "$CO_2$ Laser Annealing of Ion-Implanted Silicon", Laser-Solid Interactions and Laser Processing—1978, American Institute of Physics, 1979, pp. 381–386.

Johnson et al., "Electronic Defect Levels in Self-Implanted CW Laser-Annealed Silicon", Appl. Phys. Lett., vol. 34, No. 10, 15 May 1979, pp. 704–706.

Tamura et al., "Lattice Defects in High-Dose As Implantation into Localized Si Area", Jap. J. Appl. Phys., vol. 27, No. 12, Dec. 1988, pp. 2209–2217.

*Primary Examiner*—Mary Wilczewski
*Attorney, Agent, or Firm*—Nixon & Vanderhye

[57] ABSTRACT

The disclosed invention is a process for fabricating a semiconductor device comprising the steps of:
forming a gate electrode;
covering the gate electrode and surface of the substrate with a layer of silicon dioxide;
etching the silicon dioxide layer using an RIE method and an HF etching method to form a sidewall of silicon dioxide against each side of the gate electrode;
injecting ions into the substrate at an acceleration energy within the range of about 10–20 KeV to minimize crystalline defects in the substrate caused by ion injection;
heating the entire substrate in two successive stages: (a) initially at a first temperature within the range of 700°–850° C. for approximately one hour to recover the crystallinity of the substrate damaged in the injecting step and to inhibit diffusion of impurities; and (b) then at a second temperature within the range of 900°–1100° C. for 5–15 seconds to form a shallow depth diffusion region in the substrate.

13 Claims, 10 Drawing Sheets

PROCESS FOR PRODUCING SEMICONDUCTOR DEVICE COMPRISING TWO STEP ANNEALING TREATMENT

This is a continuation of application Ser. No. 07/736,588, filed Jul. 26, 1991, now abandoned, which is a division of application Ser. No. 07/658,345, filed Feb. 20, 1991, now abandoned.

BACKGROUND OF THE INVENTION

1. Field of the Invention

The present invention relates to a process for producing a semiconductor device and, more particularly, to a process for producing a MOS type memory cell having a so-called LDD structure by forming a diffusion region on a silicon substrate using, as a mask, a gate electrode having a side wall.

2. Description of the Related Art

Figure 6A:
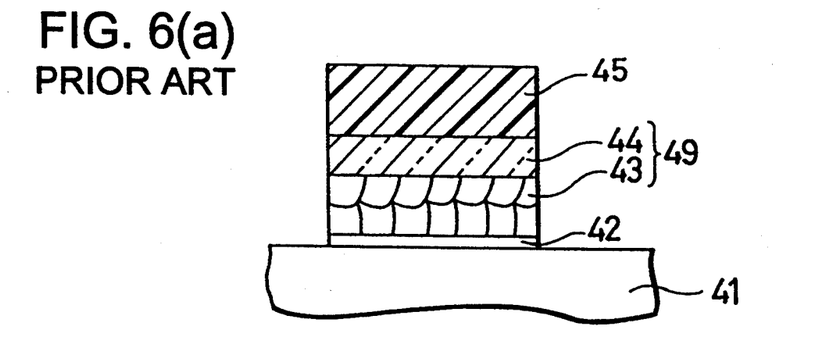
FIGS. 6(a) to 6(f) and FIGS. 7(a) to 7(b) are illustrations of known processes.

FIGS. 6(a) to 6(f) show a typical conventional process for producing a MOS type memory cell. In this process, a polysilicon layer 43 as a gate material is formed on a Si substrate 41 through the intermediary of a gate oxide film 42. As NSG layer (non-doped silicate glass layer) 44 is formed as required on the polysilicon layer 43 for the purpose of improving the gate characteristic, as shown in FIG. 6. Then, a resist layer 45 is formed thereon. Subsequently, a wet etching is effected on a resist layer 45 so as to form this resist layer into a predetermined pattern for forming gate electrode. Subsequently, a photo-etching is conducted to form a laminate structure composed of a gate electrode 49 having the polysilicon layer 43 and the NSG layer 44 and the resist layer 45, as shown in FIG. 6(a).

Figure 6B:
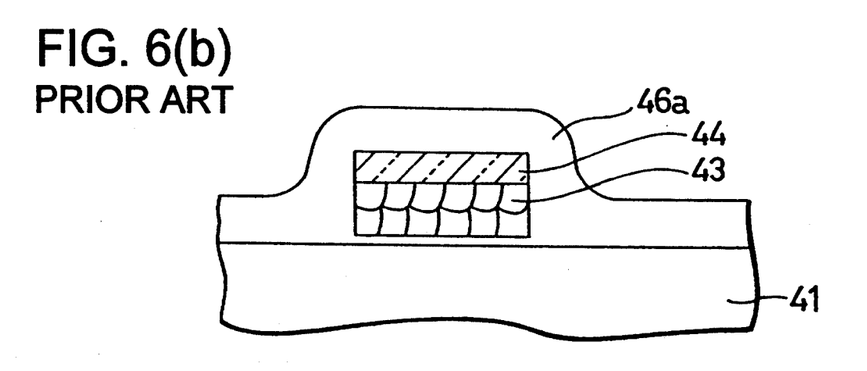
Figure 6C:
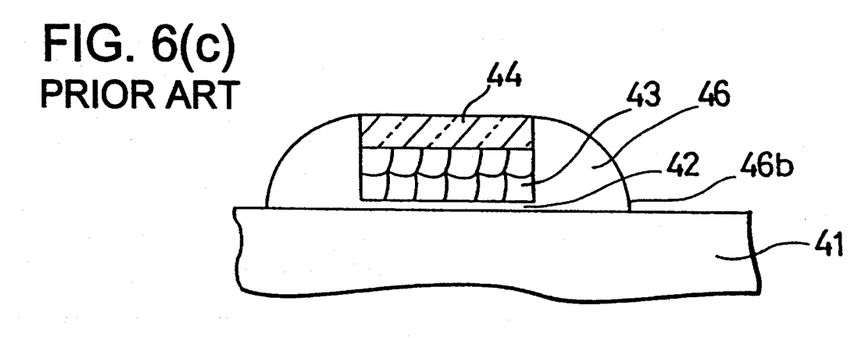

Then, after the removal of the resist layer 45, an SiO$_2$ layer 46a having a gate electrode 49 is formed on the Si substrate 41, as shown in FIG. 6(b), followed by an RIE (reactive ion etching) method for forming a side wall 46, as shown in FIG. 6(c).

Figure 6D:
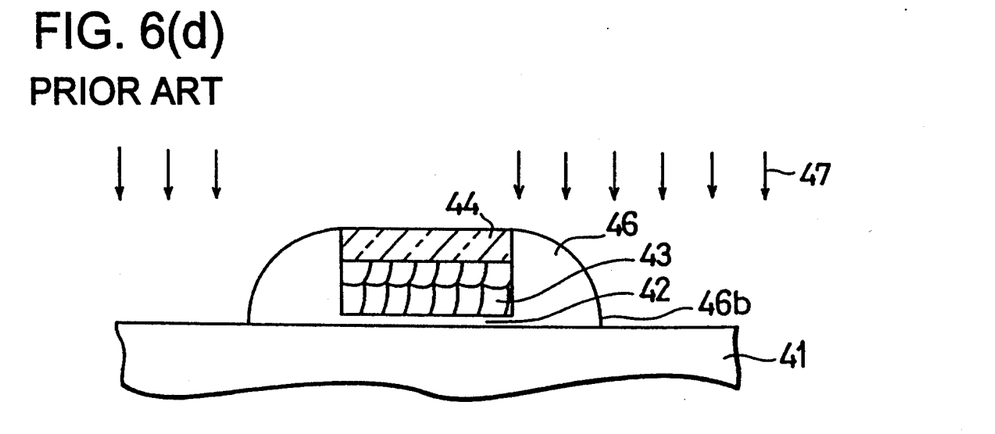
Figure 6E:
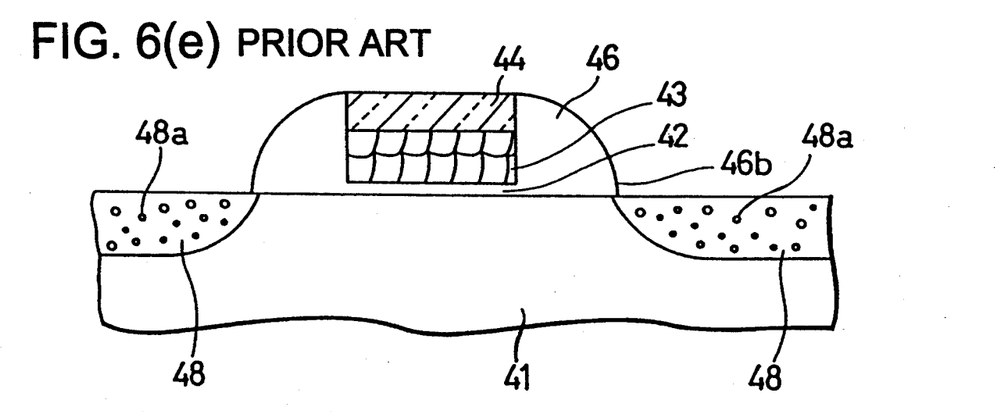

In a subsequently step, As+ ions 47 are injected as shown in FIG. 6(d) while the gate electrode 49 and the side wall 46 are used as a mask, whereby an ion injected layer (not shown) is formed. Then, a heat-treatment is conducted to form a source-drain diffusion region 48 on the Si substrate 41 as shown in FIG. 6(e).

Figure 6F:
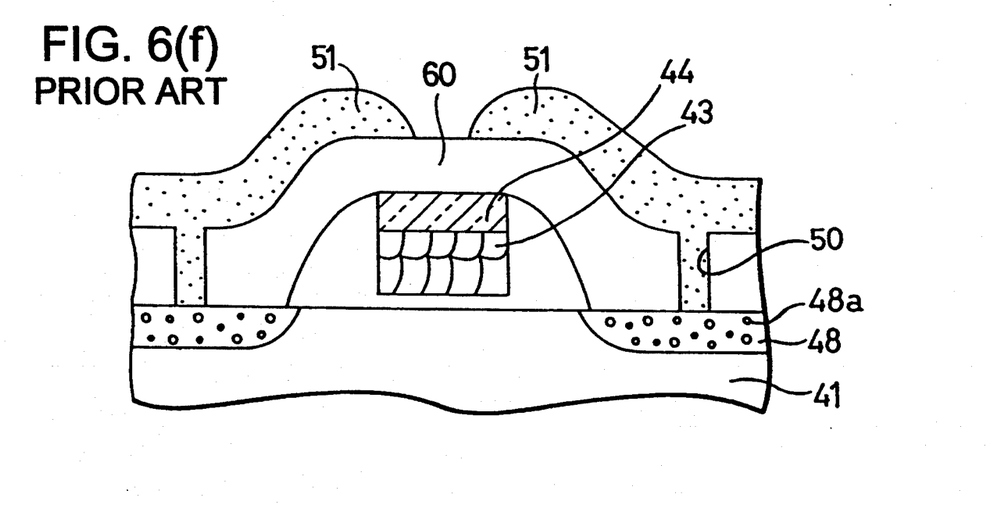

Then, a BPSG (boron-doped phospho-silicate glass) film 60 as an inter-layer insulating film is laminated on the entire area. Contact holes 50 are formed through the BPSG film so as to reach the diffusion region 48 and a metallic wiring 51 is laid to fill the contact holes 50, whereby a MOS type memory cell is formed as shown in FIG. 6(f).

This known process suffers from the following disadvantages. Namely, there is a risk that crystalline defects tend to be generated in the side wall edge portion 46b and in the diffusion region 48, as a result of injection of As+ ions 47 (see FIG. 6(d)) and/or the heat treatment (see FIG. 6(e)).

More specifically, the RIE method conducted for the purpose of forming the side wall 46 (see FIG. 6(c)) also damages the Si substrate. In the subsequent heat treatment, defects are produced around the damaged portions of the Si substrate since these damaged portions serve as nuclei. In addition, the side wall edge portion 46b forms a steep slope with respect to the surface of the Si substrate so that a large stress i incurred on the surface region of the Si substrate. As a consequence, the stress is transferred into the Si substrate through a subsequent heat treatment, with the result that crystalline defect is formed in the Si substrate.

In addition, there is a risk that the BPSG layer 60 is diffused as impurities into the diffusion region 48 during formation of this film 60. This undesirably increases electrical leak in the products add reduces the yield of the products.

Figure 7A:
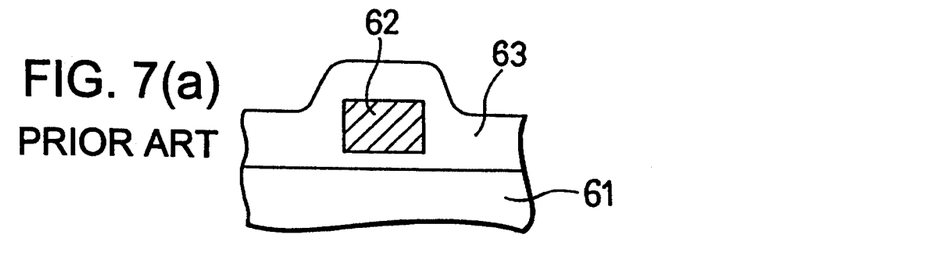
Figure 7B:
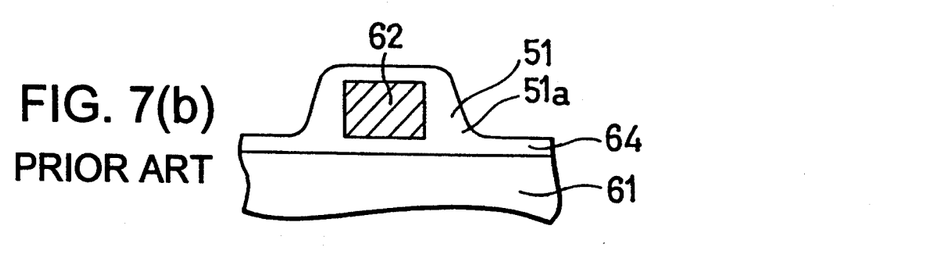
Figure 8:
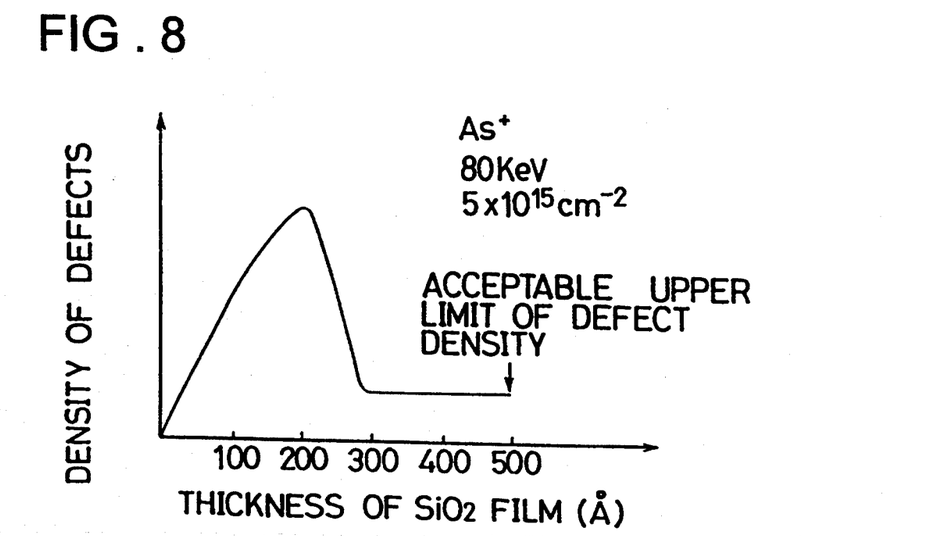
FIG. 8 is a graph showing the relationship between the thickness of the $SiO_2$ film and the density of defects in an Si substrate.

The following process has been proposed to overcome the above-described problems. In this proposed process an SiO$_2$ layer 63 is formed on a gate electrode 62 of a Si substrate 61 as shown in FIG. 7(a), followed by a combination of an RIE method and an HF etching method so that a side wall 51 is formed while leaving an SiO$_2$ film on the gate electrode 62, as shown in FIG. 7(b). According to this method, damaging of the Si substrate 61 due to RIE method is avoided. In addition, a taper 51a is formed by the residue of the SiO$_2$ film on the end of the side wall, thus relieving stress applied to the Si substrate. However, when ion injection is conducted on this laminate structure, oxygen is introduced into the Si substrate from the SiO$_2$ film formed thereon, so that a crystalline defect is formed in the diffusion layer formed by the heat treatment. More specifically, referring to FIG. 8, the defect density is small when the thickness of a SiO$_2$ film 64 ranges between 300 and 500 Å but is increased when the thickness is reduced, in case where the As+ ions are injected at an energy density of 80 KeV and a dosage $5 \times 10^{15}$ cm$^{-2}$. In this process, however, the film thickness largely fluctuates because of use the RIE method for forming the side wall, so that it is not easy to control the film thickness to the above-mentioned restricted range. Thus, the SiO$_2$ film thickness below 300 Å undesirably allows implantation of a large quantity of oxygen atoms from the SiO$_2$ film into the Si substrate, thus inducing generation of crystalline defects.

Figure 9:
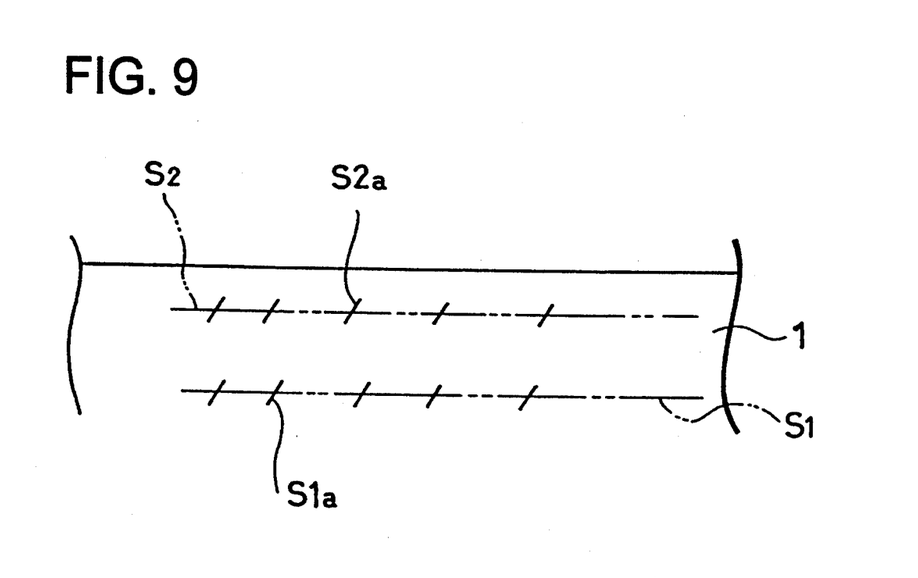
FIG. 9 is an illustration of locations of defects generated in an Si substrate.

The current demand for larger scale of integration of semiconductor devices requires that the diffusion layer be formed to a smaller depth and with a high quality devoid of any defect. A process which employs a short heat treatment at high temperature subsequent to the ion injection of FIG. 6(d) is considered as being promising process for obtaining such a thin diffusion layer of a high quality. According to this process, however, slip lines are liable to be formed around transfer loops which are generated during the heat-treatment and which function as nuclei, due to a rapid cooling which is essential in the short heat-treatment. More specifically, as shown in FIG. 9, defects tend to be generated in two stages: namely, in the interface S1 between the amorphous Si and the crystalline Si of the Si substrate 1 and in a region near the projection range (Pr) S2. In FIG. 9, S1a and S2a show defects which originate from transfer loops. In particular, the defect S1a generated in the deep interface S1 is liable to cause a leak in the diffusion layer.

The following reference is available as showing an art relevant to the invention of this application:

M. Tamura et al, Japanese Journal of Applied Physics, 27(12), 2209–2217, 1988

SUMMARY OF THE INVENTION

The present invention provides a process for producing a semiconductor device comprising the steps of:

(a) on a semiconductor Si substrate having a gate electrode formed thereon through the intermediary of an SiO$_2$ film, i) forming as side wall of $SiO_2$ on the side of said gate electrode followed by formation of an SiN film over the entire surface of the Si substrate, or ii) forming on the entire surface of said substrate, an $SiO_2$ film and and SiN film in sequence, followed by formation of a side wall of $SiO_2$ on the side of said gate electrode;

(b) injecting ions into said substrate; and (c) subjecting said substrate to a heat treatment with or without removal of the side wall of $SiO_2$, thereby forming a diffusion region in the substrate.

The process of the present invention can prevent the generation of crystalline defects which tend to be produced in the diffusion region of the Si substrate and in the side wall of the gate electrode material in the process for producing a semiconductor device having an LDD structure, while enabling formation of a diffusion region of a small depth and fewer defects, well coping with the demand for larger scales of integration of the semiconductor device. As a consequence, the electrical leak in the semiconductor device is reduced to improve the yield of the products.

The invention also provides a process for producing a semiconductor device having the steps of: preparing a semiconductor substrate having a gate electrode formed thereon through the intermediary of an $SiO_2$ film, forming a side wall of $SiO_2$ on the side of the gate electrode, effecting an ion injection with a low acceleration energy, conducting a heat treatment at a low temperature, and conducting a short heat treatment at a high temperature thereby forming a diffusion region. According to the invention, it is possible to obtain a diffusion region with a small depth and reduced defects.

DESCRIPTION OF THE PREFERRED EMBODIMENTS

According to the present invention, a side wall of $SiO_2$ can be formed on the side of a gate electrode by depositing an $SiO_2$ film using a CVD method followed by etching using preferably the combination of an RIE method and an HF etching method.

Examples of ions to be used in the ion injection are $As^+$ ions, $BF_2^+$ ions or the like.

When the formation of the SiN film in the step (a) i) of the process of the invention is effected by a CVD method while the heat treatment in the step (c) is effected without removal of the side wall, it is preferred that the SiN film has a thickness of 100Å to 300Å and the ion injection is conducted at an acceleration energy level of about 40 to 90 KeV and a dosage of about 3 to $5 \times 10^{15}$ $cm^{-2}$, while the heat treatment is preferably conducted at a temperature ranging between about 800° and 900° C.

According to the method, the knock-on effect of oxygen atom upon ion injection can be avoided and the growth of transfer loops can be prevented.

When the process of the present invention is carried out such that the formation of the $SiO_2$ film and the formation of the SiN film in the step (a) ii) are effected by a heat oxidation method and a CVD method, respectively, while the heat-treatment in the step (c) is effected after removal of the side wall, it is preferred that the thickness of the $SiO_2$ film and SiN film preferably ranges between about 50 and 150Å and that the ion injection is conducted with an acceleration energy of 40 to 90 KeV and at a dosage of about 3 to $5 \times 10^{15}$ $cm^{-2}$, while the heat treatment is preferably conducted at a temperature of about 800° to 900° C.

According to this method, since the ions are injected through the $SiO_2$ film and the SiN film, implantation of the oxygen atoms from the $SiO_2$ film into the Si substrate can be diminished. In addition, an implantation of nitrogen atom from the SiN film into the Si substrate is extremely small. Furthermore, the etching during forming the side wall is stopped by the SiN film so that the thickness control of the $SiO_2$ film and the SiN film is facilitated and qualities of these films can be improved. Consequently, defective crystals in the diffusion region produced by the heat treatment can be diminished.

When the process of the present invention is carried out in such a manner that the formation of the $SiO_2$ film and the formation of the SiN film in the step (a) ii) are effected by a heat-oxidation method and a nitriding method, respectively, while the heat-treatment in the step (c) is conducted after removal of the side wall, it is preferred that the $SiO_2$ film has a thickness of about 50 to 150Å and the SiN film has a thickness of about 5 to 15Å, and that the ion injection is conducted with a low acceleration energy of 20 to 50 KeV and a dosage of about 3 to $5 \times 10^{15}$ $cm^{-2}$, while the heat-treatment is preferably conducted at a temperature of about 800° to 900° C.

According to this process, the implantation of oxygen atom from the $SiO_2$ film and nitrogen atom from the SiN film into the Si substrate can be reduced, so that the thickness control of the $SiO_2$ film and the SiN film is facilitated and these films can be improved on quality. Consequently, defective crystals in the diffusion region produced by the heat treatment can be diminished. Furthermore, the depth of the diffusion region is reduced because the acceleration energy with which the ion injection is conducted can be reduced.

When the process of the present invention is carried out such that a side wall of $SiO_2$ is formed on the side of the gate electrode while the ion injection is conducted with a low acceleration energy followed by a low-temperature heat treatment and a subsequent short heat-treatment at a high temperature, it is preferred that the ion injection is conducted with a low acceleration energy level Of about 10 to 20 KeV and at a dosage of about 2 to $5 \times 10^{15}$ cm$^{-2}$, and that the low-temperature heat-treatment is effected at about 700° to 850° C. while the short heat-treatment is conducted for 5 to 15 seconds at about 900° to 1100° C.

According to the method of the present invention, the crystallinity of the ion injection layer formed by the low-energy ion injection is recovered by the low-temperature heat treatment, while the subsequent short heat-treatment at high temperature provides a high activated rate of the diffusion region with a reduced defects. Furthermore, the depth of the diffusion region can be reduced by virtue of the low acceleration level employed in the ion injection.

Preferred embodiments of the present invention will be described only for an illustrative purpose. Thus, the described embodiments are not intended for limiting the scope of the invention.

First Embodiment

Figure 1A:
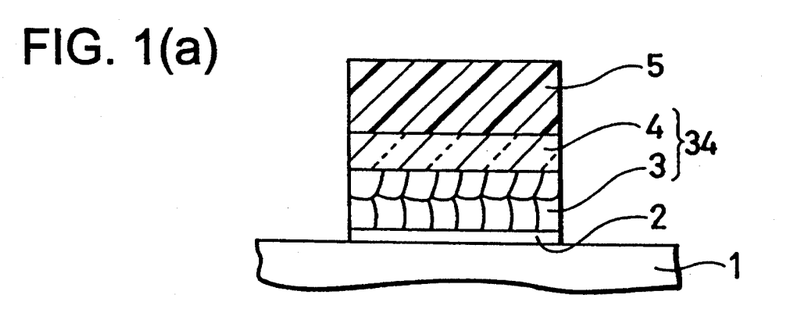
FIGS. 1(a) to 1(f) are illustrations of steps of an embodiment of the process of the present invention.

As shown in FIG. 1(a), a gate electrode 34 composed of a polysilicon layer 3 and an NSG layer 4 is formed on an Si substrate 1 through the intermediary of an SiO$_2$ film 2, and a resist layer 5 is laminated on the gate electrode 34. Namely, the gate oxide film 2, the polysilicon layer 3, the NSG layer 4 and the resist layer 5 are formed in sequence on the Si substrate 1 by a known process. Subsequently, a wet etching process is executed to patternize the resist layer into a predetermined pattern for forming the gate electrode. Subsequently, an RIE method is conducted so that a laminate structure as shown in FIG. 1(a) is obtained.

Figure 1B:
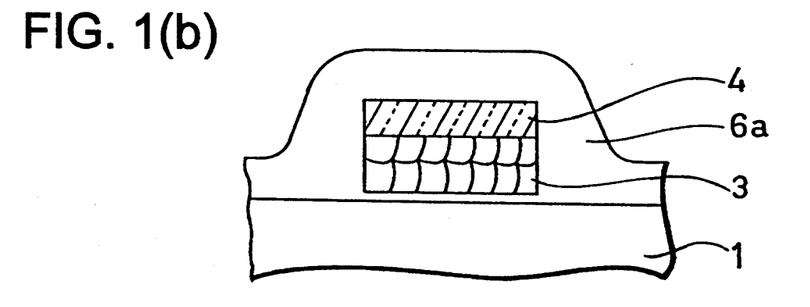
Figure 1C:
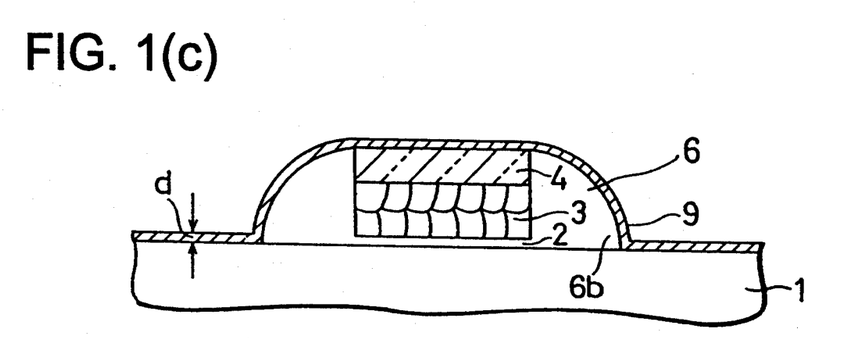

In a next step, the resist layer 5 is removed by a known method and an HTO (high temperature oxide) film (SiO$_2$ layer) 6a is formed in a thickness of 3800Å under reduced pressure as shown in FIG. 1(b). Then, an RIE method and an HF etching method are executed to etch the laminate structure until the Si substrate 1 is exposed, thus forming a sidewall 6. Then, CVD method is conducted under reduced pressure so as to laminate an SiN film 9 in a thickness of 200Å, as shown in FIG. 1(c).

Figure 1D:
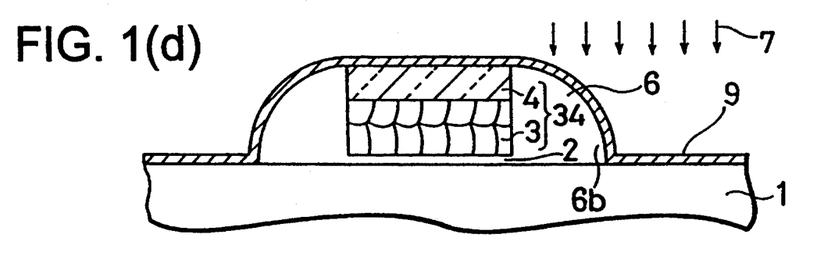

Then, as shown in FIG. 1(d), injection of As$^+$ ions 7 is conducted while using the laminate of the gate electrode 34 and the side wall 6 as a mask, at an acceleration energy level of about 80 KeV and a dosage of $1 \times 10^{15}$ to $1 \times 10^{16}$ cm$^{-2}$, thus forming the ion injection layer (not shown).

Figure 1E:
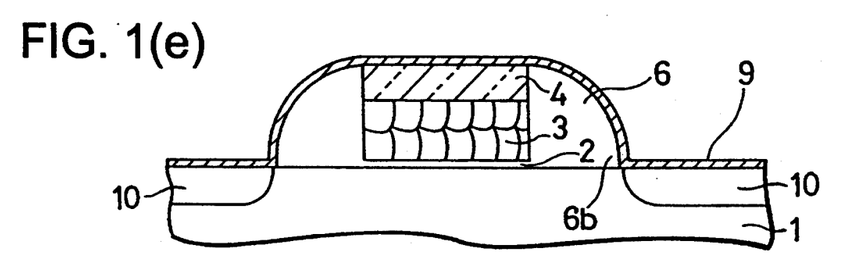

Subsequently, a heat-treatment is effected at 800° to 900° C. so that a source-drain diffusion region 10 is formed in the Si substrate as shown in FIG. 1(e).

Figure 1F:
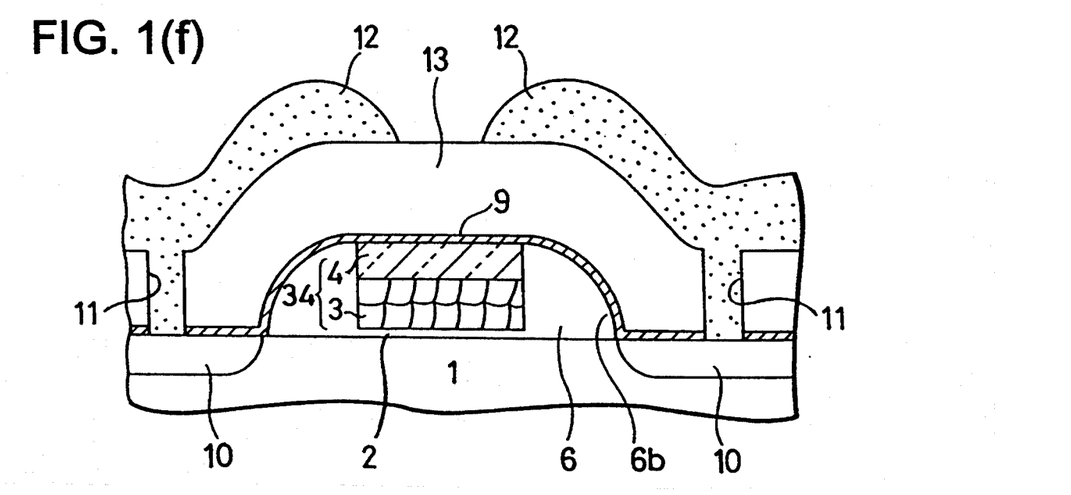

Then, ordinary steps are taken so as to form a MOS type memory cell. Namely, after laminating a BPSG film 13 as an inter-layer insulating film over the entire area, an annealing is conducted in an N$_2$ gas atmosphere so as to flatten this layer. Subsequently, contact holes 11 are formed to reach the diffusion region 10, and a metallic wiring 12 is laid to fill these contact holes, whereby the MOS type memory cell is completed.

According to the first embodiment of the process as described, after the formation of the side wall the SiN film is formed over the entire area, so that the knock-on effect of oxygen atom is eliminated and the growth of transfer loops which occurs upon the heat treatment is completely prevented. Furthermore, diffusion of impurities from the BPSG film also is prevented. As a consequence, the electric characteristics of the product device are stabilized to improve the yield of the products.

Second Embodiment

Figure 2A:
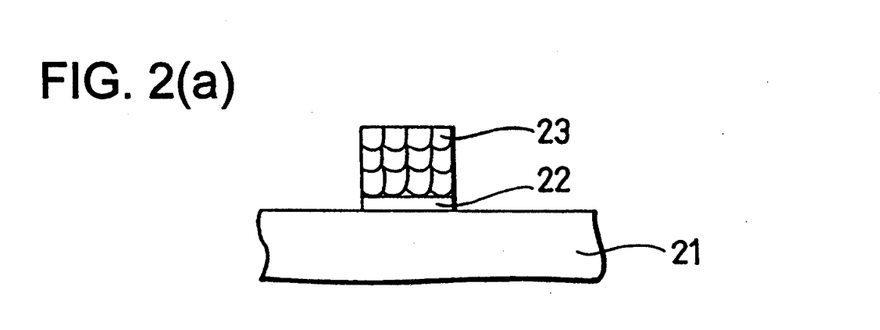
FIGS. 2(a) to 2(f) are illustrations of steps of another embodiment of the process of the present invention.

Referring to FIG. 2(a), a semiconductor substrate 21 is produced which has a gate electrode 23 made of a gate material polysilicon on the substrate surface through the intermediary of an SiO$_2$ film 22, as in the case of the first embodiment.

Figure 2B:
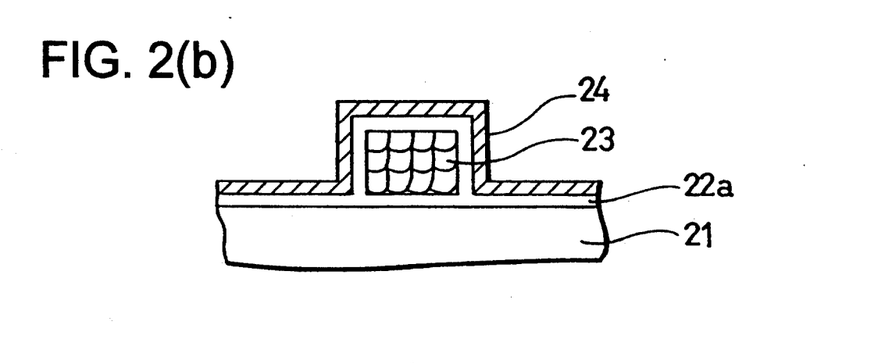

Subsequently, an SiO$_2$ film 22a is formed over the entire area of the gate electrode 23 and the Si substrate 21 to have a thickness of 100Å by a heat-oxidation process conducted under normal pressure. Then, on the SiO$_2$ film 22a, an SiN film of 100Å thick is formed by CVD process conducted under reduced pressure, as shown in FIG. 2(b).

Figure 2C:
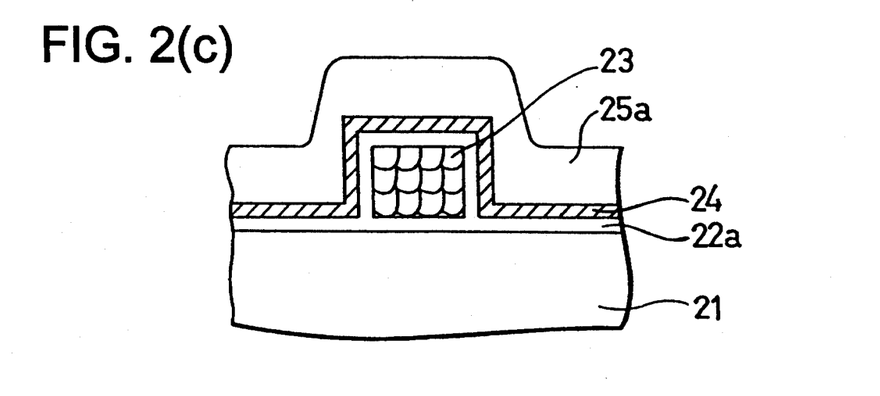

Then, an HTO film (SiO$_2$ film) 25a for forming an side wall is laminated on the SiN film 24 as shown in FIG. 2(c).

Figure 2D:
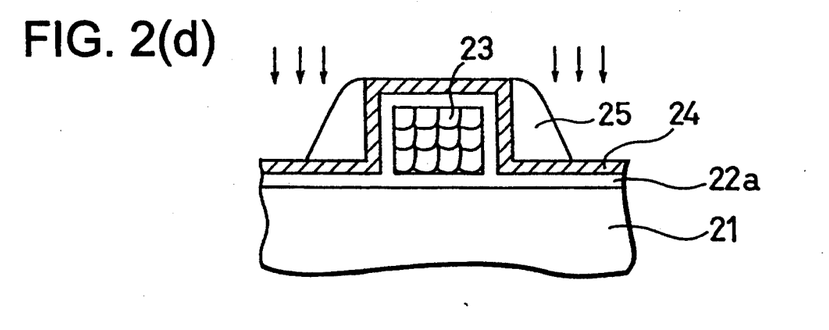

Then, the HTO film 25a is etched by an RIE method and an HF etching method until the SiN film 24 is exposed, whereby a side wall 25 is formed only on the peripheral side of the gate electrode as shown in FIG. 2(d).

Subsequently, injection of As$^+$ ions is conducted under conditions of 80 KeV and $5 \times 10^{15}$ cm$^{-2}$, by using the side wall 25, SiN film 24 and the SiO$_2$ film as a mask, whereby an ion injection layer (not shown) is formed.

Figure 2E:
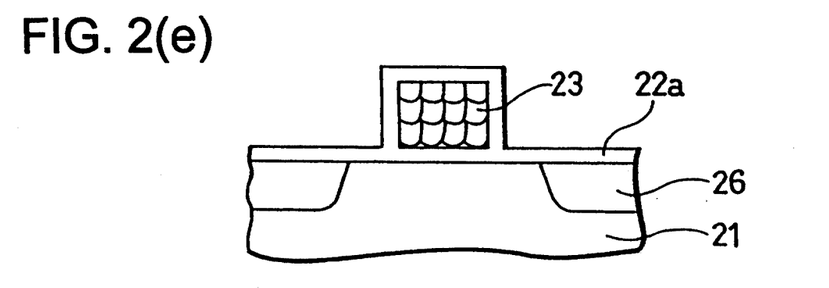

Then, an RIE method and an HF etching method are executed so as to remove the side wall 25, and a phosphate boiling process is executed for removing the SiN film 24, followed by a heat-treatment conducted at 800° to 900° C., whereby a laminate structure having a diffusion region 26 is obtained as shown in FIG. 2(e).

Figure 2F:
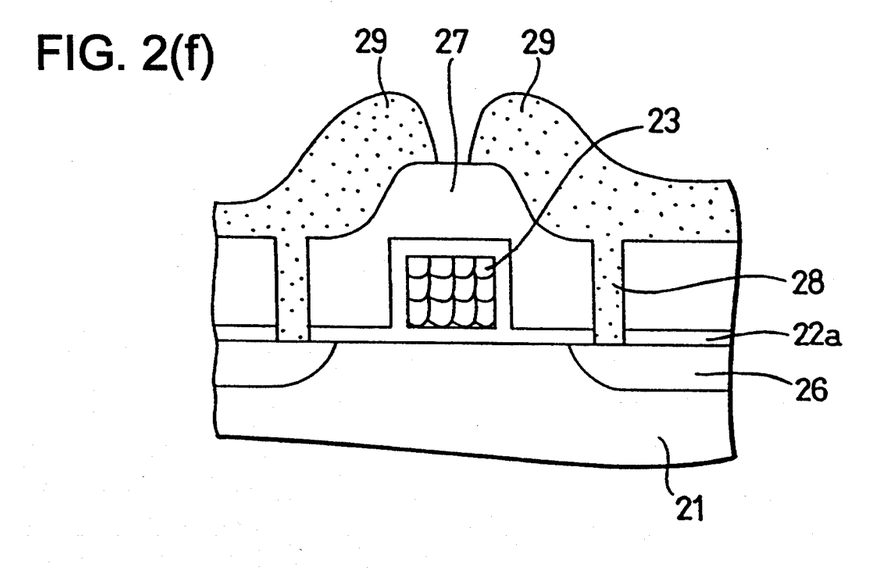

Then, as in the case of the first embodiment, an inter-layer insulating film 27 is formed over the entire area and an N$_2$ annealing is conducted to flatten this film 27. Finally, contact holes 28 are formed and a metallic wiring 29 is laid to fill these contact holes, thus completing a MOS type memory cell as shown in FIG. 2(f).

Figure 10:
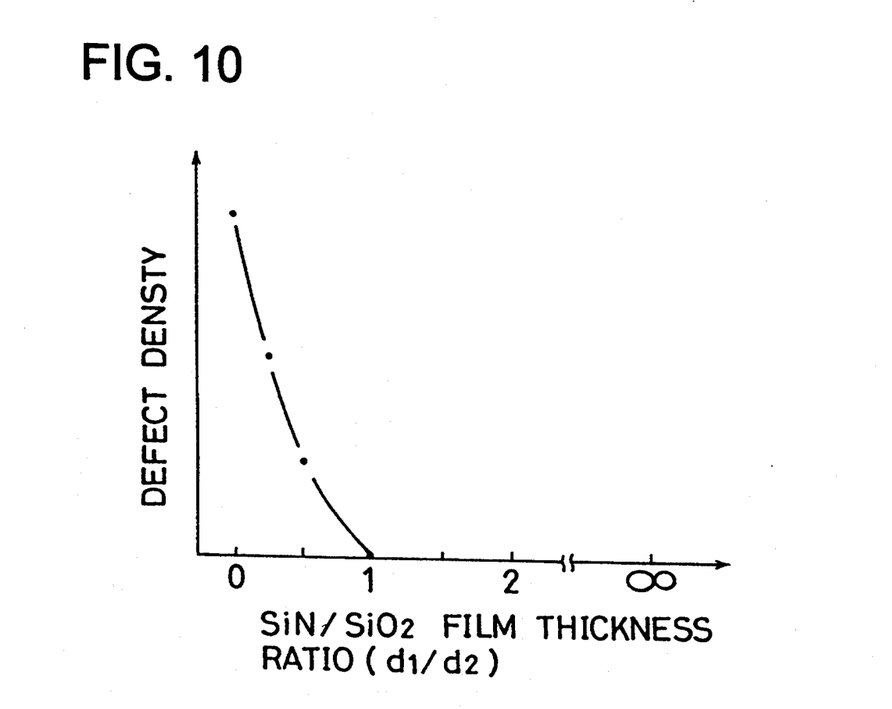
FIG. 10 is a graph showing the relationship between the $SiN/SiO_2$ film thickness ratio and the density of defects in an Si substrate.

In the second embodiment as described, the thickness d$_1$ of the SiN film and the thickness d$_2$ of the SiO$_2$ film are suitably determined such that the total thickness d (=d$_1$+d$_2$) of these films ranges from about 200Å to about 400Å. Preferably, these thicknesses are determined to simultaneously meet the condition of d$_1 \geq$ d$_2$ and d$_2 >$ 50Å. The relationship between the defect density in the diffusion region and the thickness ratio d$_1$/d$_2$ as obtained when As$^+$ ions are injected is shown in FIG. 10.

Third Embodiment

A diffusion region was formed in the same manner as the second embodiment except that an SiN film of about 10Å in thickness was formed by effecting a lamp annealing on the SiO$_2$ film in an ammonia gas atmosphere at 900° to 1000° C. and that injection of As$^+$ ions was effected with a low acceleration energy level of 40 KeV and a dosage of $5 \times 10_{15}$ cm$^{-2}$. As a consequence, a diffusion region was formed to have a small depth of about 1000Å with reduced generation of defective crystals.

Fourth Embodiment

Figure 3A:
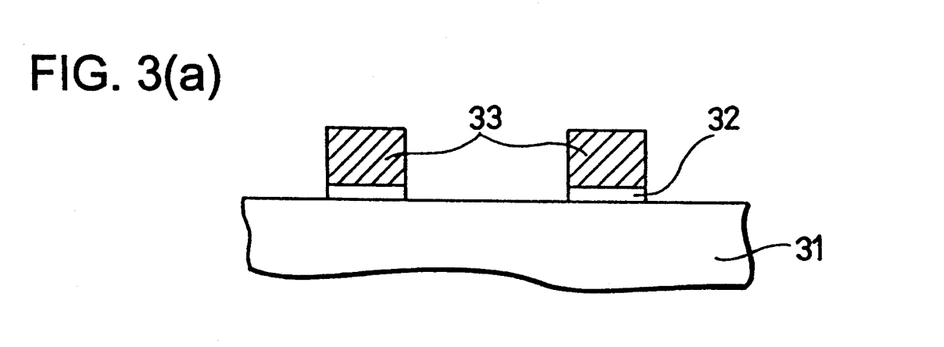
FIGS. 3(a) to 3(c) are illustrations of steps of still another embodiment of the process of the present invention.
Figure 3B:
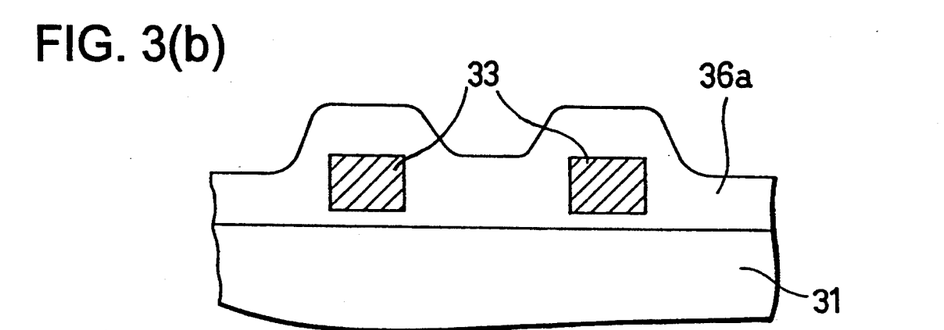
Figure 3C:
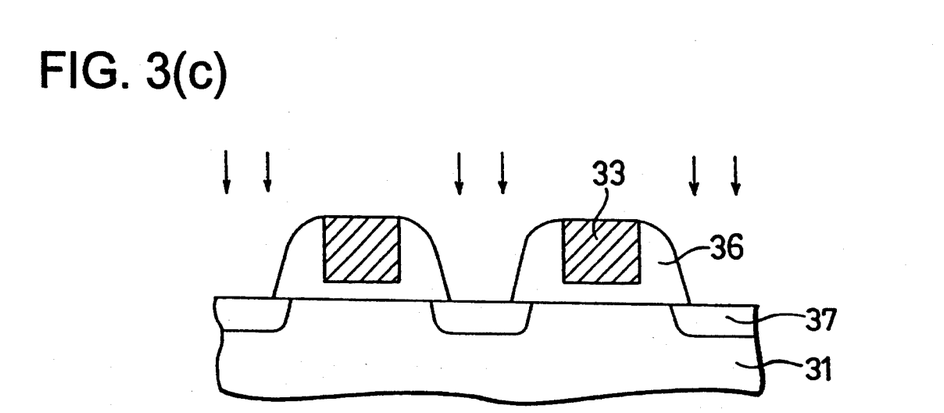
Figure 4:
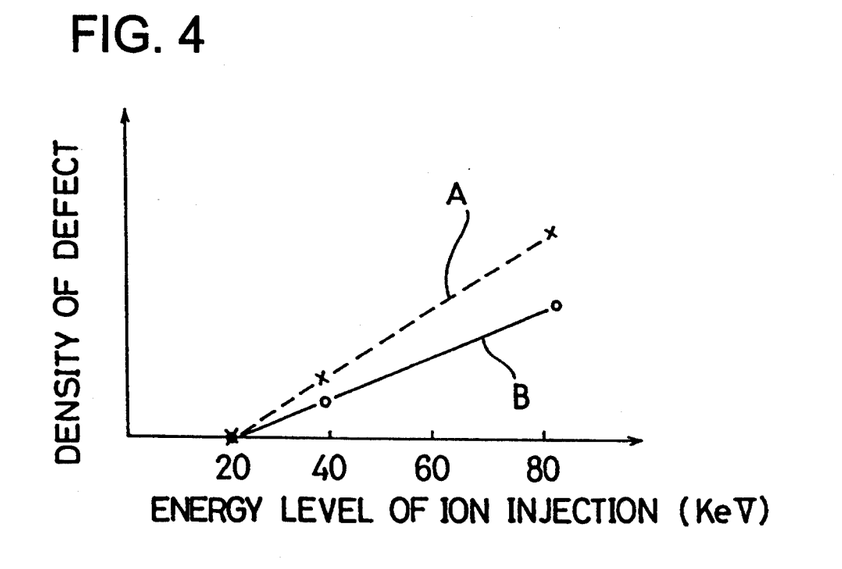
FIG. 4 is a graph showing the relationship between the density of defects in an Si substrate and the energy level of ion injection, wherein A represents the. interface between the amorphous phase and crystalline phase of Si in the Si substrate,, and B shows the above-mentioned relationship in the projection range.
Figure 5:
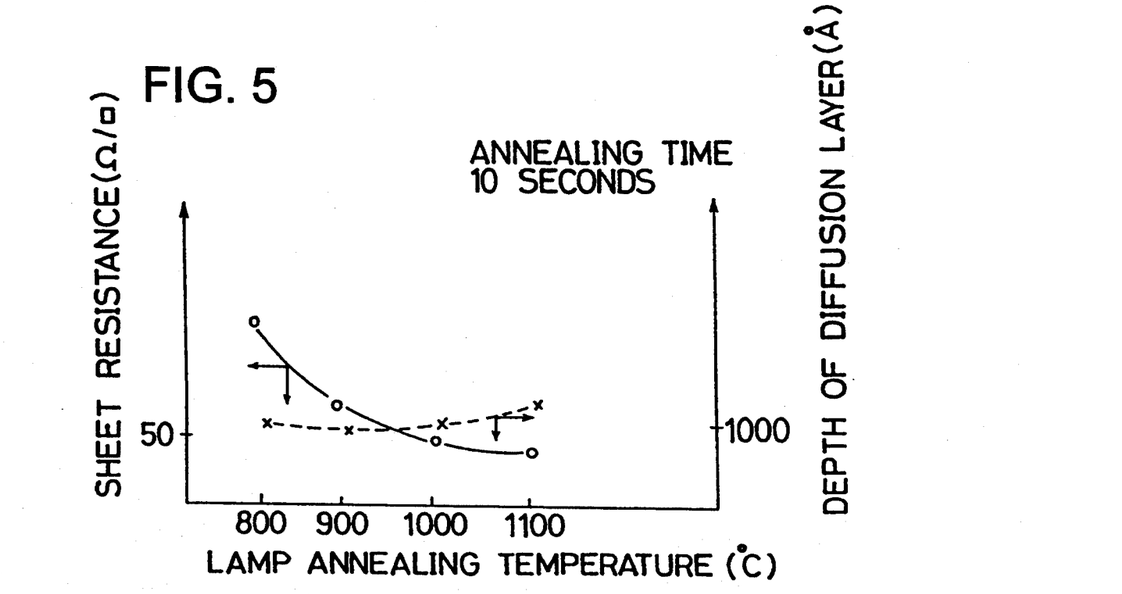
FIG. 5 is a graph showing the relationship between a lamp annealing temperature and the sheet resistance and the relationship between the lamp annealing temperature and the depth of a diffusion region.

As shown in FIG. 3(a), an Si substrate 31, having a gate electrode 33 formed of a polysilicon layer through the intermediary of an SiO$_2$ film 32, was prepared in the same manner as the second embodiment, followed by a lamination with an SiO₂ layer 36a by an HTO method as shown in FIG. 3(b). Subsequently, an etching was effected by an RIE method and a HF etching method until the gate electrode 33 is exposed so as to form a side wall 36 on the peripheral side of the gate electrode Then, As+ ions were injected with a low acceleration energy of 20 KeV and a dosage of $5 \times 10^{15}$ cm$^{-2}$ so as to form an ion injection layer of about 1000Å as shown in FIG. 3(c). Subsequently, a low-temperature heat-treatment was conducted at 800° C. for 1 hour in a nitrogen atmosphere. The crystallinity was recovered from a disordered state caused by the ion injection, thanks to the low level of the acceleration energy employed in the ion injection, as will be clearly seen from FIG. 4. It is thus understood that the use of a low level acceleration energy in the ion injection reduces the density of defect in the interface (line A in FIG. 4) between the amorphous and crystalline phases of Si and in the projection range (line B in FIG. 4). Then, a short heat-treatment at high temperature was conducted at 1000° C. for 10 seconds so that a diffusion region of a small depth was obtained, as will be seen from FIG. 5. More specifically, it will be understood that the sheet resistance is reduced when the temperature of the short heat-treatment is elevated. For instance, a low level of resistance not higher than 50 Ω/□ is obtained when this heat-treatment is effected at 1000° C. and the depth of the diffusion region is maintained substantially constantly at 1000Å when the temperature of this heat-treatment is below 1000° C.

What is claimed is:

1. A method for making an integrated circuit structure containing a semiconductor silicon substrate including at least one gate electrode formed thereon through the intermediary of a silicon dioxide film, comprising:
   covering the gate electrode and surface of the substrate with a layer of silicon dioxide;
   etching the silicon dioxide layer using an RIE method and an HF etching method to form a sidewall of silicon dioxide against each side of the gate electrode;
   injecting ions into the substrate at an acceleration energy sufficiently low to minimize crystalline defects in the substrate caused by ion injection;
   heating the entire substrate in two successive stages:
   (a) initially at a first temperature for a first time period sufficient to recover the crystallinity of the substrate damaged in the injecting step and to inhibit diffusion of impurities; and
   (b) then at a second temperature higher than the first temperature for a second time period shorter than the first time period by at least an order of magnitude, the second temperature being sufficiently high and the second time being sufficiently short to form a shallow depth diffusion region in the substrate.

2. The method in claim 1, wherein the first temperature is within the range of 700° C. to 850° C. and the first time period is approximately one hour.

3. The method in claim 1, wherein the second temperature is within the range of 900° C. to 1100° C. and the second time period is within the range of five to fifteen seconds.

4. The method in claim 1, wherein the ion injection is conducted at an acceleration energy level of about 20 KeV and a dosage of about 2 to $5 \times 10^{15}$ cm$^{-2}$.

5. A method for making an integrated circuit structure containing a semiconductor silicon substrate including at least one gate electrode formed thereon through the intermediary of a silicon dioxide film, comprising the steps of:
   covering the gate electrode and surface of the substrate with a layer of silicon dioxide;
   etching the silicon dioxide layer;
   injecting ions into the substrate at an acceleration energy level within the range of about 10 to 20 KeV in order to minimize crystalline defects in the substrate caused by ion injection;
   heating the entire substrate in successive stages:
   (a) initially at a first temperature for a time period to recover the crystallinity of the substrate damaged in the injecting step and to inhibit diffusion of impurities; and
   (b) then at a second temperature higher than the first temperature for a second time period shorter than the first time period.

6. The method in claim 5 wherein the etching step includes using an RIE method and an HF method to form a sidewall of silicon dioxide against each side of the gate electrode.

7. The method in claim 5 wherein the first temperature is within the range of 700° C. to 850° C. and the first time period is approximately one hour.

8. The method in claim 5 wherein the second temperature is within the range of 900° C. to 1100° C. and the second time period is within the range of five to fifteen seconds.

9. The method in claim 5 wherein the ion injection is conducted at a dosage of about 2 to $5 \times 10^{15}$ cm$^{-2}$.

10. A method for making an integrated circuit structure containing a semiconductor silicon substrate including at least one gate electrode formed thereon through the intermediary of a silicon dioxide film, comprising:
    covering the gate electrode and surface of the substrate with a layer of silicon dioxide;
    etching the silicon dioxide layer;
    injecting ions into the substrate at a low acceleration energy to minimize crystalline defects in the substrate caused by ion injection;
    heating the entire substrate in successive stages:
    (a) initially at a first temperature substantially within the range of about 700° C. to 850° C. for approximately one hour to recover the crystallinity of the substrate damaged in the injecting step and to inhibit diffusion of impurities; and
    (b) then at a second temperature higher than the first temperature for a second time period shorter than the first time period.

11. The method in claim 10 wherein the etching step includes using an RIE method and an HF method to form a sidewall of silicon dioxide against each side of the gate electrode.

12. The method in claim 10 wherein the second temperature is within the range of 900° C. to 1100° C. and the second time period is within the range of five to fifteen seconds.

13. The method in claim 10 wherein the ion injection is conducted at an acceleration energy level of about 10 to 20 KeV and a dosage of about 2 to $5 \times 10^{15}$ cm$^{-2}$.

* * * * *